(12) United States Patent
Wang et al.

(10) Patent No.: US 9,766,537 B2
(45) Date of Patent: Sep. 19, 2017

(54) MASK

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Deshuai Wang, Beijing (CN); Liang Wang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 68 days.

(21) Appl. No.: 14/769,766

(22) PCT Filed: Apr. 14, 2015

(86) PCT No.: PCT/CN2015/074735
§ 371 (c)(1),
(2) Date: Aug. 21, 2015

(87) PCT Pub. No.: WO2016/065816
PCT Pub. Date: May 6, 2016

(65) Prior Publication Data
US 2016/0252806 A1    Sep. 1, 2016

(30) Foreign Application Priority Data

Oct. 28, 2014 (CN) .......................... 2014 1 0586860

(51) Int. Cl.
*G03F 1/50* (2012.01)
*G03F 1/54* (2012.01)

(52) U.S. Cl.
CPC . *G03F 1/50* (2013.01); *G03F 1/54* (2013.01)

(58) Field of Classification Search
CPC ..... G03F 1/26; G03F 1/36; G03F 1/50; G03F 1/54; G03F 1/58
(Continued)

(56) References Cited

U.S. PATENT DOCUMENTS

2002/0021403 A1* 2/2002 Kim .................... G02F 1/13458
349/187
2003/0027366 A1* 2/2003 Dulman .................... G03F 1/29
430/5

(Continued)

FOREIGN PATENT DOCUMENTS

CN    100507713    4/2005
CN    1633625    6/2005

(Continued)

OTHER PUBLICATIONS

International Search Report and Written Opinion with English Language Translation, dated Jul. 3, 2015, Application No. PCT/CN2015/074735.

*Primary Examiner* — John A McPherson
(74) *Attorney, Agent, or Firm* — Blakely Sokoloff Taylor & Zafman LLP

(57) ABSTRACT

The present disclosure relates to the field of photolithography technologies. Disclosed is a mask comprising a transparent substrate, the transparent substrate being provided thereon with a semi-transmitting film layer and a light barrier layer to form a non-transmitting region, a semi-transmitting region, and a full transmitting region, the transparent substrate being further provided with a light extinction film layer located at a vicinity of the full transmitting region to weaken an intensity of ultraviolet light transmitting through the vicinity of the full transmitting region. The size of the via formed after an exposure process with the mask is less affected by a change in the thickness of the photoresist surrounding the via.

8 Claims, 3 Drawing Sheets

(58) Field of Classification Search
USPC .............................................................. 430/5
See application file for complete search history.

(56) References Cited

U.S. PATENT DOCUMENTS

2004/0121244 A1* 6/2004 Misaka ..................... G03F 1/29
430/5
2009/0061330 A1* 3/2009 Irie ........................... G03F 1/32
430/5

FOREIGN PATENT DOCUMENTS

| CN | 1721988   | 1/2006 |
| CN | 104407496 | 3/2015 |
| JP | 2008026668 | 2/2008 |

\* cited by examiner

MASK

RELATED APPLICATIONS

The present application claims the benefit of Chinese Patent Application No. 201410586860.8, filed Oct. 28, 2014, the entire disclosure of which is incorporated herein by reference.

FIELD OF THE DISCLOSURE

The present disclosure relates to the field of photolithography technologies, and more particularly to a mask.

BACKGROUND OF THE DISCLOSURE

FIG. 1 is a schematic diagram of the exposure process for an existing large area semi-transmitting mask. As shown in the figure, the large area semi-transmitting mask comprises a non-transmitting region A covered by metal Cr, a semi-transmitting region B, and a full transmitting region C. Photoresists 5 are shaped with different thicknesses at the underlying layer after an exposure process with the conventional semi-transmitting mask.

FIG. 2 is a schematic diagram of the distribution of the photoresists on the substrate as shown in FIG. 1 after a development process. As shown in the figure, the thickness of the unexposed photoresist 5 corresponding to the non-transmitting region A is D, the thickness of the photoresist 5 corresponding to the semi-transmitting region B is d, and the reference numeral 60 denotes a via pattern formed in the full transmitting region C.

After the exposure and development of the substrate, the photoresist 5 surrounding the formed via 60 is the photoresist 5 corresponding to the semi-transmitting region. In the exposure process, the region of the photoresist 5 where the via 60 is to be formed is affected by the intensity of the ultraviolet light 3 in the vicinity of the region, such that the size of the via 60 finally formed is affected significantly. Since the intensity of the ultraviolet light 3 in the vicinity of the via 60 results directly in a change in the thickness of the photoresist 5 surrounding the via 60, the size of the via 60 is shown to be affected significantly by the change in the thickness of the photoresist 5 surrounding the via 60.

SUMMARY

The present disclosure provides a mask, with which a via formed after an exposure process has a size that is less affected by a change in the thickness of the photoresist surrounding the via.

To achieve the above object, the present disclosure provides the following technical solutions:

A mask comprising a transparent substrate, the transparent substrate being provided thereon with a semi-transmitting film layer and a light barrier layer to form a non-transmitting region, a semi-transmitting region, and a full transmitting region, the transparent substrate being further provided with a light extinction film layer located at a vicinity of the full transmitting region to weaken an intensity of ultraviolet light transmitting through the vicinity of the full transmitting region.

When the ultraviolet light passes through the aforementioned mask, the intensity of the ultraviolet light transmitting through the vicinity of the full transmitting region can be weakened by the light extinction film layer located surrounding the full transmitting region, i.e. the intensity of the ultraviolet light received in the vicinity of the region of the substrate where the via is to be formed can be weakened by the light extinction film layer. Therefore, the via formed after a development process is less affected by the intensity of the ultraviolet light in the vicinity thereof; moreover, the change in the thickness of the photoresist surrounding the via is decreased, and hence the size of the via is shown to be less affected by the change in the thickness of the photoresist surrounding the via.

Thus, the size of the via formed after exposure and development with the aforementioned mask is less affected by the change in the thickness of the photoresist surrounding the via. This is especially favorable to the exposure process for the large area semi-transmitting mask.

Optionally, the light extinction film layer is located at a side of the semi-transmitting film layer facing away from the transparent substrate.

Optionally, the light extinction film layer is adhered to the semi-transmitting film layer by an adhesive layer.

Optionally, the light extinction film layer is located between the transparent substrate and the semi-transmitting film layer.

Optionally, the light extinction film layer is a phase-reversing film that is used for delaying a phase of the ultraviolet light transmitting in a thickness direction thereof by half a wavelength.

Optionally, the light extinction film layer is a ½ wave plate.

Optionally, the light extinction film layer is a light masking layer.

Optionally, the light masking layer is a metal chromium film layer.

Optionally, the light extinction film layer is of a closed annular structure.

Optionally, the spacing between an inner side and an outer side of the light extinction film layer, along the direction parallel to the transparent substrate, is 1 to 2 μm.

DETAILED DESCRIPTION

The technical solutions of embodiments of the present disclosure will be described clearly and completely, in combination with the accompanying drawings of embodiments of the present disclosure. Obviously, the described embodiments are only a part of, and not all of embodiments of the present disclosure. All other embodiments derived, by the person skilled in the art without making inventive efforts, from the embodiments described in this disclosure, are within the protection scope of the present disclosure.

Figure 1:
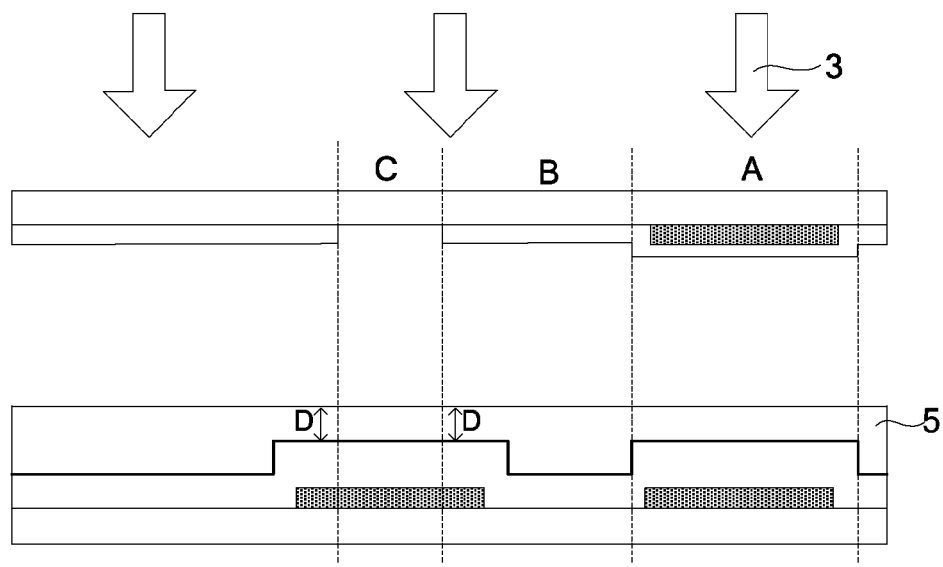
FIG. 1 is a schematic diagram of the exposure process for an existing large area semi-transmitting mask.
Figure 2:
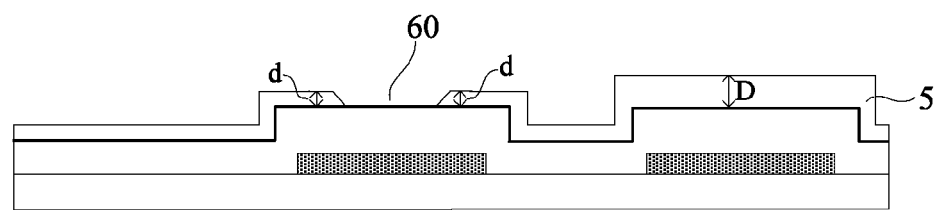
FIG. 2 is a schematic diagram of the distribution of the photoresist on the substrate as shown in FIG. 1 after a development process.
Figure 3:
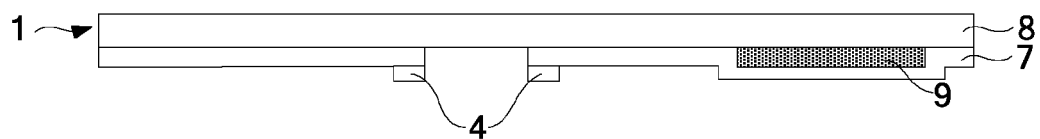
FIG. 3 is a structural schematic diagram of a mask provided by an embodiment of the present disclosure.

FIG. 3 is a structural schematic diagram of a mask provided by an embodiment of the present disclosure. As shown in the figure, the embodiment of the present disclosure provides a mask 1 which comprises a transparent substrate 8. The transparent substrate 8 is provided thereon with a semi-transmitting film layer 7 and a light barrier layer 9 to form a non-transmitting region A, a semi-transmitting region B, and a full transmitting region C. The transparent substrate 8 is further provided with a light extinction film layer 4 located at a vicinity of the full transmitting region C to weaken an intensity of the ultraviolet light 3 transmitting through the vicinity of the full transmitting region C.

Figure 4:
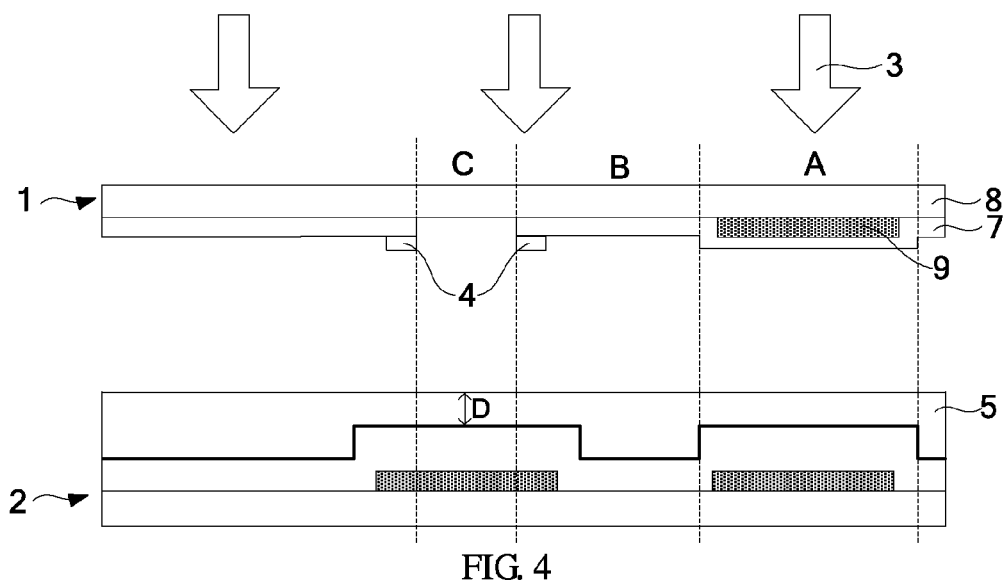
FIG. 4 is a schematic diagram of the exposure process for the mask as shown in FIG. 3.
Figure 5:
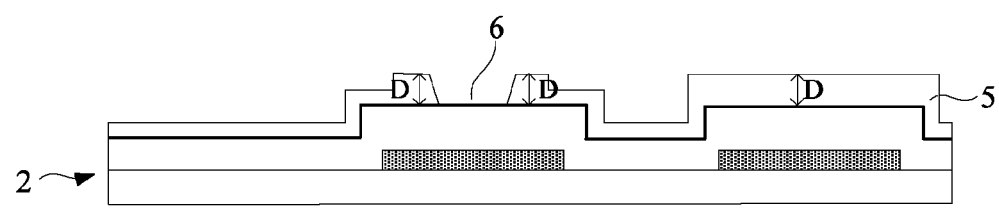
FIG. 5 is a schematic diagram of the distribution of the photoresist on the substrate as shown in FIG. 4 after a development process.

FIG. 4 is a schematic diagram of the exposure process for the mask as shown in FIG. 3, and FIG. 5 is a schematic diagram of the distribution of the photoresist on the substrate as shown in FIG. 4 after a development process. As shown in the figures, when the ultraviolet light 3 passes through the aforementioned mask 1, the intensity of the ultraviolet light 3 transmitting through the vicinity of the full transmitting region C can be weakened by the light extinction film layer 4 located surrounding the full transmitting region C, i.e. the intensity of the ultraviolet light 3 received in the vicinity of the region of the substrate 2 where the via 6 is to be formed can be weakened by the light extinction film layer 4. Therefore, the via 6 formed after the development process is less affected by the intensity of the ultraviolet light 3 in the vicinity thereof; moreover, the change in the thickness of the photoresist 5 in the vicinity of the via 6 is decreased, such that the size of the via 6 is less affected by the change in the thickness of the photoresist 5 surrounding the via 6.

Thus, the size of the via 6 formed after exposure and development with the aforementioned mask 1 is less affected by the change in the thickness of the photoresist 5 surrounding the via 6.

Figure 6:
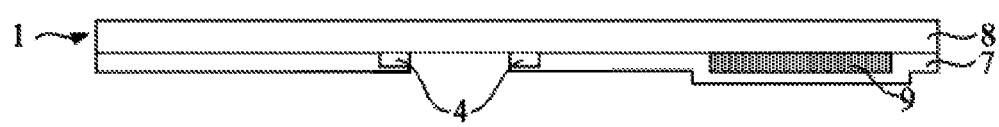
FIG. 6 is a structural schematic diagram of another mask provided by an embodiment of the present disclosure.

As shown in FIG. 3, the light extinction film layer 4 may be located at the side of the semi-transmitting film layer 7 facing away from the transparent substrate 8. Optionally, as shown in FIG. 6, the light extinction film layer 4 may also be located between the transparent substrate 8 and the semi-transmitting film layer 7. Indeed, the position of the light extinction film layer 4 on the mask 1 is not limited to the specific position as described above, as long as the light extinction film layer 4 is located in the vicinity of the full transmitting region C such that the intensity of the ultraviolet light 3 transmitting through the vicinity of the full transmitting region C can be weakened.

In an embodiment, the light extinction film layer 4 is a phase-reversing film that is used for delaying the phase of the ultraviolet light 3 transmitting in the thickness direction thereof by half a wavelength. After the ultraviolet light 3 passes through the phase-reversing film surrounding the via 6, its phase is changed by 180 degrees, being opposite to that of the ultraviolet light 3 passing through the regions other than the phase-reversing film. Therefore, the ultraviolet light 3 passing through the phase-reversing film and that passing through other regions cancel each other out due to interference, such that the intensity of the ultraviolet light 3 passing through the phase-reversing film can be reduced to zero in the exposure process, weakening the intensity of the ultraviolet light 3 in the vicinity of the full transmitting region C. Specifically, the light extinction film region 4 may be a ½ wave plate. In the case that the light extinction film layer 4 is located at the side of the semi-transmitting film layer 7 facing away from the transparent substrate 8, the light extinction film layer 4 may be adhered to the semi-transmitting film layer 7 by an adhesive layer.

In another embodiment, the light extinction film layer 4 may be a light masking layer. Due to non-transparency of the light masking layer, the intensity of the ultraviolet light 3 passing through the light masking layer can be reduced to zero in the exposure and development process, weakening the intensity of the ultraviolet light 3 transmitting in the vicinity of the full transmitting region C. If the light extinction film layer 4 is the light masking layer, however, the size of the full transparent region C of the mask 1 generally should be greater than the resolution of the exposure machine to prevent diffraction. In general, the resolution of the exposure machine is 4 μm. Specifically, the light masking layer may be a metal chromium film layer.

Figure 7:
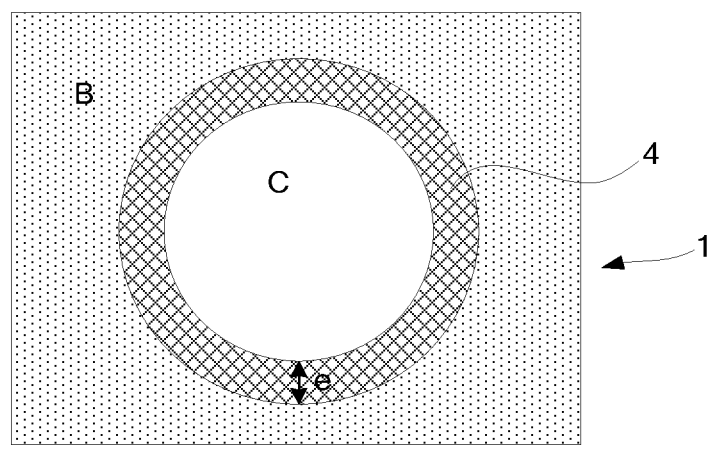
FIG. 7 is a structural schematic diagram of the light extinction film layer of a mask provided by an embodiment of the present disclosure.

FIG. 7 is a structural schematic diagram of the light extinction film layer of a mask provided by an embodiment of the present disclosure. As shown in the figure, the light extinction film layer 4 surrounding the full transmitting region C may be of a closed, annular structure. Specifically, the spacing between the inner side and the outer side of the annular light extinction film layer 4, along the direction parallel to the transparent substrate 8, may be 1 to 2 μm. Of course, the light extinction film layer 4 may be of other shapes, depending on the shape of the pattern to be formed on the substrate 2.

Obviously, various modifications and variations can be made to embodiments of the present disclosure by the person skilled in the art without departing from the spirit and scope of the present disclosure. Thus, if these modifications and variations to the present disclosure are within the scope of the appended claims of the present disclosure and the equivalents thereof, the present disclosure is intended to encompass these modifications and variations.

The invention claimed is:

1. A mask comprising:
a transparent substrate;
a mask pattern layer provided on the transparent substrate and comprising a non-transmitting region, a semi-transmitting region and a full transmitting region; and
a light extinction film layer provided at a vicinity of the full transmitting region to weaken an intensity of ultraviolet light transmitting through the vicinity of the full transmitting region;
wherein the non-transmitting region is provided with a light barrier layer, and the semi-transmitting region is provided with a semi-transmitting film layer;
wherein the light extinction film layer is of a closed annular structure; and
wherein the spacing between an inner side and an outer side of the light extinction film layer, along a direction parallel to the transparent substrate, is 1 to 2 μm.

2. The mask according to claim 1, wherein the light extinction film layer is located at a side of the semi-transmitting film layer facing away from the transparent substrate.

3. The mask according to claim 2, wherein the light extinction film layer is adhered to the semi-transmitting film layer by an adhesive layer.

4. The mask according to claim 1, wherein the light extinction film layer is located between the transparent substrate and the semi-transmitting film layer.

5. The mask according to claim 1, wherein the light extinction film layer is a phase-reversing film that is used for delaying a phase of the ultraviolet light transmitting in a thickness direction thereof by half a wavelength.

6. The mask according to claim 5, wherein the light extinction film layer is a ½ wave plate.

7. The mask according to claim 1, wherein the light extinction film layer is a light masking layer.

8. The mask according to claim 7, wherein the light masking layer is a metal chromium film layer.

* * * * *